US010460977B2

United States Patent
Breninger et al.

(10) Patent No.: US 10,460,977 B2
(45) Date of Patent: Oct. 29, 2019

(54) LIFT PIN HOLDER WITH SPRING RETENTION FOR SUBSTRATE PROCESSING SYSTEMS

(71) Applicant: Lam Research Corporation, Fremont, CA (US)

(72) Inventors: Andrew H. Breninger, Hillsboro, OR (US); Gary Lind, Nevada City, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 280 days.

(21) Appl. No.: 15/280,352

(22) Filed: Sep. 29, 2016

(65) Prior Publication Data

US 2018/0090363 A1 Mar. 29, 2018

(51) Int. Cl.
| H01L 21/687 | (2006.01) |
| F16L 37/22 | (2006.01) |
| F16F 1/04 | (2006.01) |
| F16B 21/07 | (2006.01) |

(52) U.S. Cl.
CPC ........ *H01L 21/68742* (2013.01); *F16L 37/22* (2013.01); *F16B 21/073* (2013.01); *F16F 1/045* (2013.01)

(58) Field of Classification Search
CPC .............. B23Q 7/005; H01L 21/68742; Y10S 414/135; F16F 1/045; F16F 1/065; F16B 21/07; F16B 21/073; F16L 37/22
See application file for complete search history.

(56) References Cited

U.S. PATENT DOCUMENTS

| 5,134,244 | A | | 7/1992 | Balsells |
| 5,677,824 | A | * | 10/1997 | Harashima .......... H01L 21/6831 118/723 R |
| 5,848,670 | A | * | 12/1998 | Salzman .................. B66F 7/00 187/272 |
| 5,879,128 | A | * | 3/1999 | Tietz ................. H01L 21/68742 414/757 |
| 5,992,856 | A | | 11/1999 | Balsells et al. |
| 6,148,762 | A | * | 11/2000 | Fukuda ............... C23C 16/4581 118/715 |
| 6,161,838 | A | | 12/2000 | Balsells |
| 6,435,798 | B1 | * | 8/2002 | Satoh .................. C23C 16/4586 118/728 |
| 6,641,141 | B2 | | 11/2003 | Schroeder |

(Continued)

FOREIGN PATENT DOCUMENTS

WO WO-2015148865 A1 * 10/2015 .............. F16F 1/065

OTHER PUBLICATIONS

Properties of Standard Bal Spring Canted Coil Spring Materials. https://www.balseal.com/sites/default/files/technical-library/2017-12-04/TR-9_rev%20Q_0.pdf. (Year: 2017).*

(Continued)

*Primary Examiner* — Tyrone V Hall, Jr.

(57) ABSTRACT

A lift pin holder assembly includes a lift pin holder including a central bore defining a first groove arranged on a radially inner surface of the central bore. The lift pin holder is made of a non-metallic material. A lift pin includes a second groove arranged on a radially outer surface thereof. A spring is at least partially arranged in the first groove of the lift pin holder and the second groove of the lift pin to retain the lift pin in the lift pin holder.

19 Claims, 6 Drawing Sheets

(56) References Cited

U.S. PATENT DOCUMENTS

| | | | |
|---|---|---|---|
| 6,935,466 B2 * | 8/2005 | Lubomirsky | H01L 21/68742 |
| | | | 118/724 |
| 7,210,398 B2 | 5/2007 | Balsells | |
| 7,292,428 B2 | 11/2007 | Hanawa et al. | |
| 8,167,285 B2 * | 5/2012 | Balsells | F16B 21/18 |
| | | | 267/1.5 |
| 2002/0011204 A1 * | 1/2002 | Gujer | C23C 16/405 |
| | | | 118/500 |
| 2003/0205329 A1 | 11/2003 | Gujer et al. | |
| 2006/0156981 A1 * | 7/2006 | Fondurulia | C23C 16/4408 |
| | | | 118/715 |
| 2007/0298972 A1 * | 12/2007 | Kent | H01L 21/02049 |
| | | | 505/500 |
| 2008/0124200 A1 * | 5/2008 | Lee | H01L 21/67259 |
| | | | 414/217.1 |
| 2015/0348823 A1 * | 12/2015 | Chia | H01L 21/68742 |
| | | | 269/296 |

OTHER PUBLICATIONS

Properties of Standard Bal Spring Canted Coil Spring Materials (Year: 2017).*
"Bal Springs Designed" Bal Seal Engineering, Inc. Simply a Better Solution; PN-259; Oct. 22, 2007.

* cited by examiner

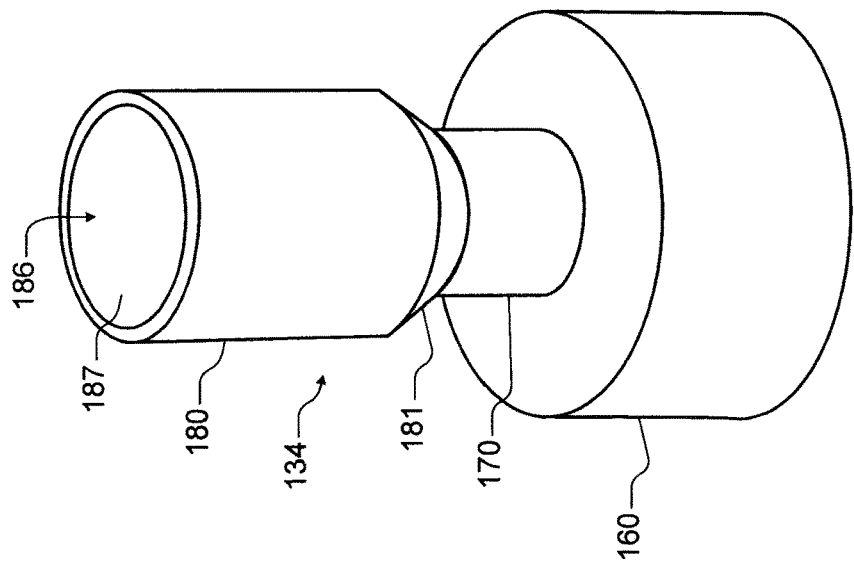
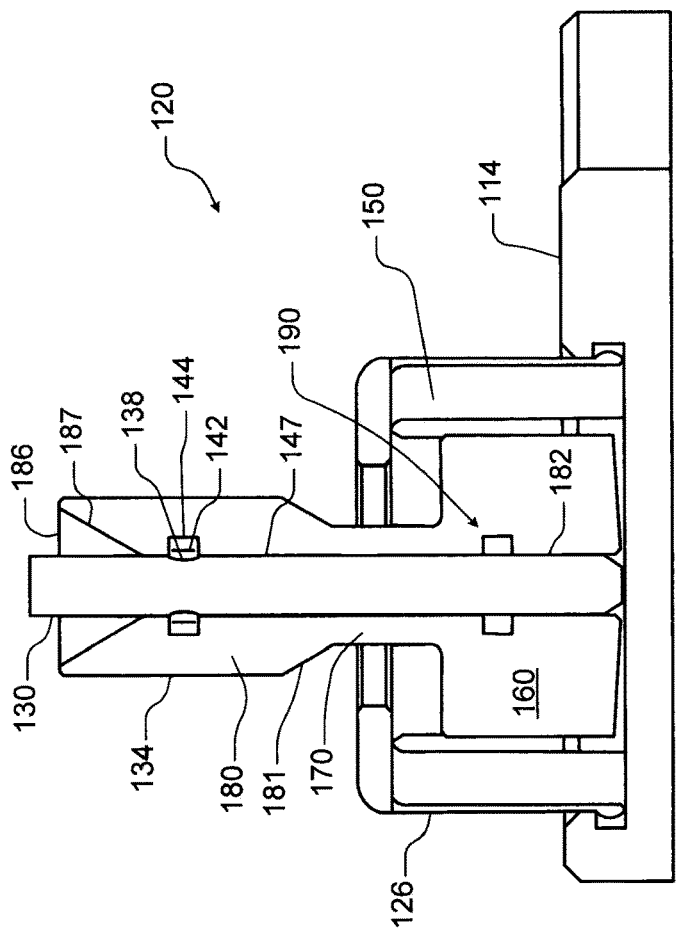

LIFT PIN HOLDER WITH SPRING RETENTION FOR SUBSTRATE PROCESSING SYSTEMS

FIELD

The present disclosure relates to substrate processing systems, and more particularly to a lift pin holder assembly for a substrate support assembly of a substrate processing system.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to deposit, etch, ash, clean or otherwise perform treatment of film on a substrate such as a semiconductor wafer. The substrate processing systems typically include a processing chamber, a gas distribution device and a substrate support. During processing, the substrate is arranged on the substrate support. Different gas mixtures may be introduced into the processing chamber. Radio frequency (RF) plasma and/or heat may be used to activate chemical reactions.

Lift pins may be used to allow delivery and removal of the substrate from the processing chamber using a robot arm. Normally, an upper end of the lift pins is located flush with or below an upper surface of the substrate support. During substrate delivery or removal, the lift pins are raised relative to an upper surface of the substrate support to lift the substrate and provide clearance between the substrate and the substrate support. The clearance between the substrate and the substrate support allows an end effector of the robot arm to be inserted or removed.

A bottom portion of the lift pins is located in and retained by a lift pin holder. The lift pin holder is made of metal. The metal in the lift pin holder can cause metal contamination of the substrates during processing at high temperature and/or using certain process chemistries.

SUMMARY

A lift pin holder assembly includes a lift pin holder including a central bore defining a first groove arranged on a radially inner surface of the central bore. The lift pin holder is made of a non-metallic material. A lift pin includes a second groove arranged on a radially outer surface thereof. A spring is at least partially arranged in the first groove of the lift pin holder and the second groove of the lift pin to retain the lift pin in the lift pin holder.

In other features, the lift pin holder is made of ceramic. The spring comprises a metal. The spring comprises a metal including nickel alloy. The spring includes a coil spring. The spring includes a canted coil spring.

In other features, the lift pin is made of a material including sapphire. The lift pin includes a lower portion having a cylindrical outer cross-section. The lift pin includes a middle portion having a cylindrical outer cross-section that has a smaller diameter than the cylindrical outer cross-section of the lower portion. An upper portion has a cylindrical outer cross-section that has a smaller diameter than the cylindrical outer cross-section of the lower portion and a greater diameter than the cylindrical outer cross-section of the middle portion.

In other features, an inverted cone-shaped cavity is located on a top surface of the upper portion. The spring has a rounded square shape with an opening located at one corner thereof. Opposite sides of the spring are separated by a distance that is less than an outer diameter of the lift pin and opposite corners that are separated by a distance that is greater than or equal to an outer diameter of the lift pin. The spring is made of nickel alloy.

A lift pin holder assembly includes a lift pin holder including a central bore defining a first groove arranged on a radially inner surface of the central bore. The lift pin holder is made of ceramic. A lift pin includes a second groove arranged on a radially outer surface thereof. A spring is at least partially arranged in the first groove of the lift pin holder and the second groove of the lift pin to retain the lift pin in the lift pin holder. The spring includes a coil spring that is made of metal.

In other features, the metal includes nickel alloy. The coil spring includes a canted coil spring. The lift pin is made of a material including sapphire.

In other features, the lift pin includes a lower portion having a cylindrical outer cross-section; a middle portion having a cylindrical outer cross-section that has a smaller diameter than the cylindrical outer cross-section of the lower portion; and an upper portion having a cylindrical outer cross-section that has a smaller diameter than the cylindrical outer cross-section of the lower portion and a greater diameter than the cylindrical outer cross-section of the middle portion. An inverted cone-shaped cavity is located on a top surface of the upper portion.

A lift pin holder assembly includes a lift pin holder including a central bore defining a first groove arranged on a radially inner surface of the central bore. The lift pin holder is made of ceramic. The lift pin includes a lower portion having a cylindrical outer cross-section; a middle portion having a cylindrical outer cross-section that has a smaller diameter than the cylindrical outer cross-section of the lower portion; and an upper portion having a cylindrical outer cross-section that has a smaller diameter than the cylindrical outer cross-section of the lower portion and a greater diameter than the cylindrical outer cross-section of the middle portion. The upper portion includes an inverted cone-shaped cavity located on a top surface of the upper portion. A lift pin includes a second groove arranged on a radially outer surface thereof. The lift pin is made of sapphire. A spring is made of metal and is at least partially arranged in the first groove of the lift pin holder and the second groove of the lift pin to retain the lift pin in the lift pin holder.

On other features, the spring includes a canted coil spring. The spring has a rounded square shape with an opening located at one corner thereof. Opposite sides of the spring are separated by a distance that is less than an outer diameter of the lift pin and opposite corners that are separated by a distance that is greater than or equal to an outer diameter of the lift pin.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 3 is a side cross-sectional view of an example of the lift pin holder and lift pin according to the present disclosure;

FIG. 4 is a perspective view of an example of the lift pin holder according to the present disclosure;

In the drawings, reference numbers may be reused to identify similar and/or identical elements.

DETAILED DESCRIPTION

A lift pin holder assembly according to the present disclosure includes a lift pin holder, a lift pin and a spring. The lift pin holder is made of a non-metallic material. Various different types of springs that are disclosed herein can be used to retain the lift pin in the lift pin holder. In some examples, the spring is made of metal. Metal contamination of substrates during processing is reduced by reducing the mass of metal in the lift pin holder assembly. In other words, the metal mass is eliminated in the body of the lift pin holder and is limited to the metal mass of the spring. In addition, the spring has limited exposure to process conditions due to the location of the spring inside the lift pin holder.

In some examples, the lift pin holder is made of a ceramic material, although other non-metallic materials can be used. In some examples, the spring includes nickel alloy, although other metals can be used. In some examples, the spring includes a coil spring that is installed in a groove located in an inner cavity of the lift pin holder. The lift pin holder thermally insulates the spring. As a result, the temperature of the spring is reduced. At the reduced temperatures, it is less likely that metal contamination will develop and reach the substrate.

Figure 1A:
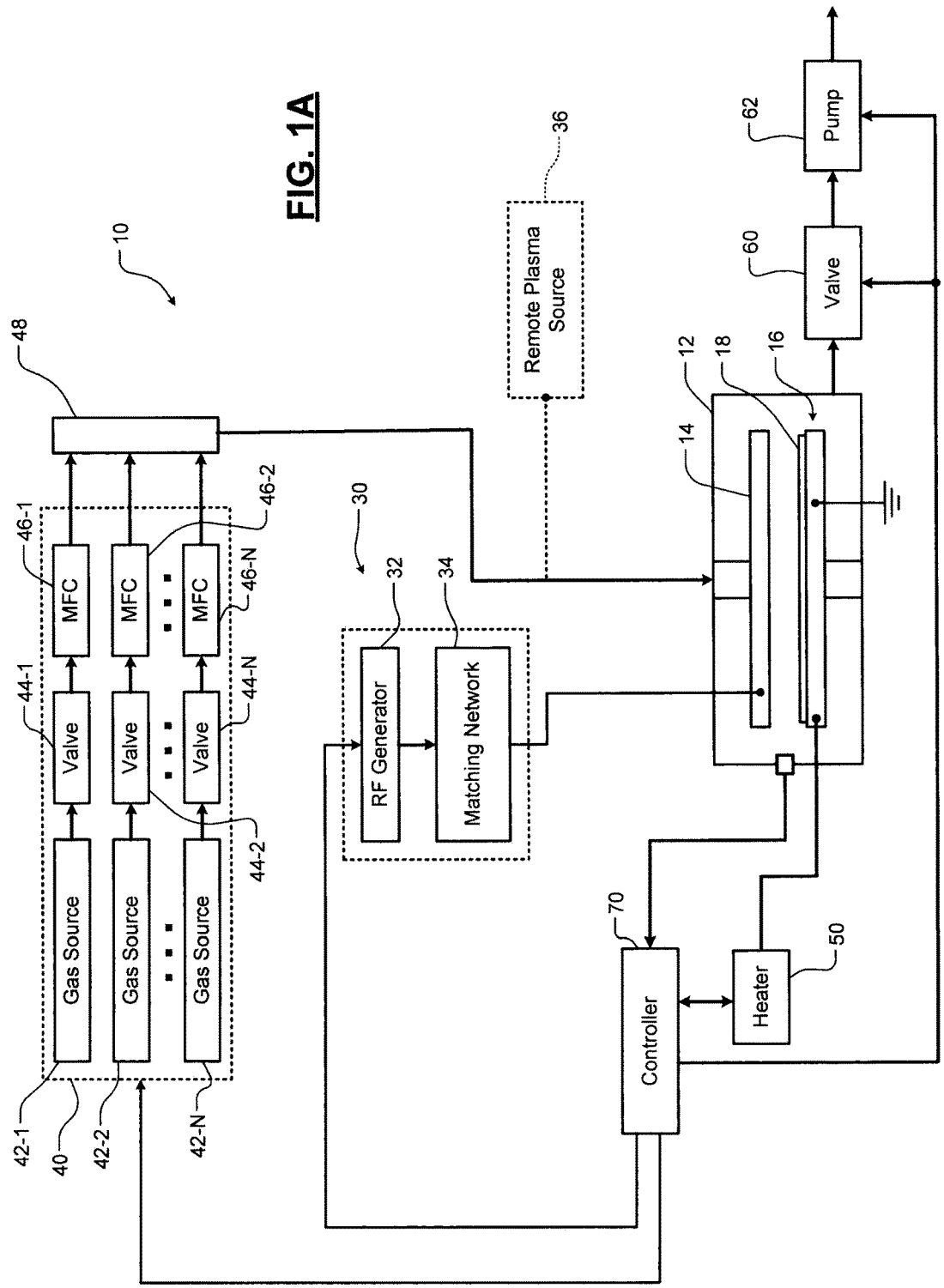
FIGS. 1A and 1B are functional block diagrams of examples of substrate processing chambers including a lift pin holder assembly according to the present disclosure.
Figure 1B:
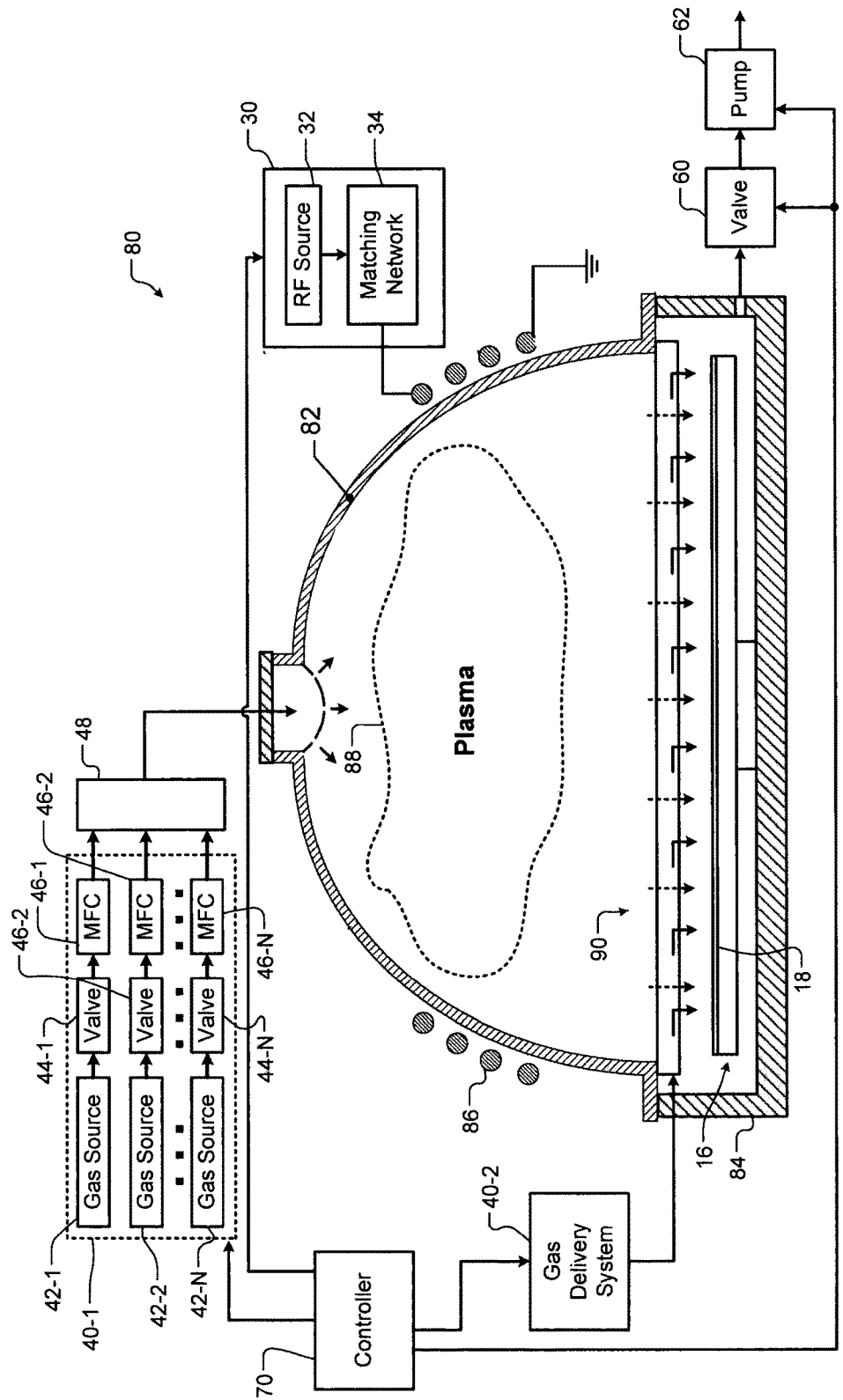

Referring now to FIGS. 1A and 1B, examples of substrate processing systems for performing substrate treatment such as deposition, cleaning, etching, ashing or other substrate treatment are shown. While specific examples of substrate processing systems are shown, the lift pin holder assembly can be used with any type of substrate processing system.

A substrate processing system 10 in FIG. 1A includes a processing chamber 12 that encloses other components of the substrate processing system 10 and contains the RF plasma (if used). The substrate processing system 10 includes a showerhead 14 and a substrate support assembly 16. A substrate 18 is arranged on the substrate support assembly 16. The showerhead 14 introduces and distributes process gases.

If plasma is used, the plasma can be direct or remote plasma. In this example, an RF generating system 30 generates and outputs an RF voltage to either the showerhead 14 or the substrate support assembly 16 (the other is DC grounded, AC grounded or floating). For example only, the RF generating system 30 may include an RF voltage generator 32 that generates the RF voltage that is fed by a matching network 34 to the showerhead 14 or the substrate support assembly 16. Alternately, the plasma may be delivered by a remote plasma source 36.

A gas delivery system 40 includes one or more gas sources 42-1, 42-2, . . . , and 42-N (collectively gas sources 42), where N is an integer greater than zero. The gas sources 42 supply one or more etch gas mixtures, precursor gas mixtures, cleaning gas mixtures, ashing gas mixtures, etc. to the processing chamber 12. Vaporized precursor may also be used. The gas sources 42 are connected by valves 44-1, 44-2, . . . , and 44-N (collectively valves 44) and mass flow controllers 46-1, 46-2, . . . , and 46-N (collectively mass flow controllers 46) to a manifold 48. An output of the manifold 48 is fed to the processing chamber 12. For example only, the output of the manifold 48 is fed to the showerhead 14.

A heater 50 may be connected to a heater coil (not shown) arranged in the substrate support assembly 16. The heater 50 may be used to control a temperature of the substrate support assembly 16 and the substrate 18. A valve 60 and pump 62 may be used to evacuate reactants from the processing chamber 12. A controller 70 may be used to control components of the substrate processing system 10. For example only, the controller 70 may be used to control flow of process gases, monitoring of process parameters such as temperature, pressure, power, etc, striking and extinguishing plasma, removal of reactants, etc.

Referring now to FIG. 1B, another example of a substrate processing chamber 80 is shown. The processing chamber includes an upper chamber 82 and a lower chamber 84 including the substrate support assembly 16. An inductive coil 86 is arranged around the upper chamber 82. The RF generating system 30 outputs RF power to the inductive coil 86 to create plasma 88 in the upper chamber 82. A showerhead 90 filters ions and delivers radicals to the lower chamber 84. The showerhead 90 may also be used to supply secondary gas such as precursor gas from a gas delivery system 40-2 to the lower chamber 84. While two example substrate processing systems are shown, the lift pin holder assembly described herein can be used with any other type of substrate processing system.

Figure 2:
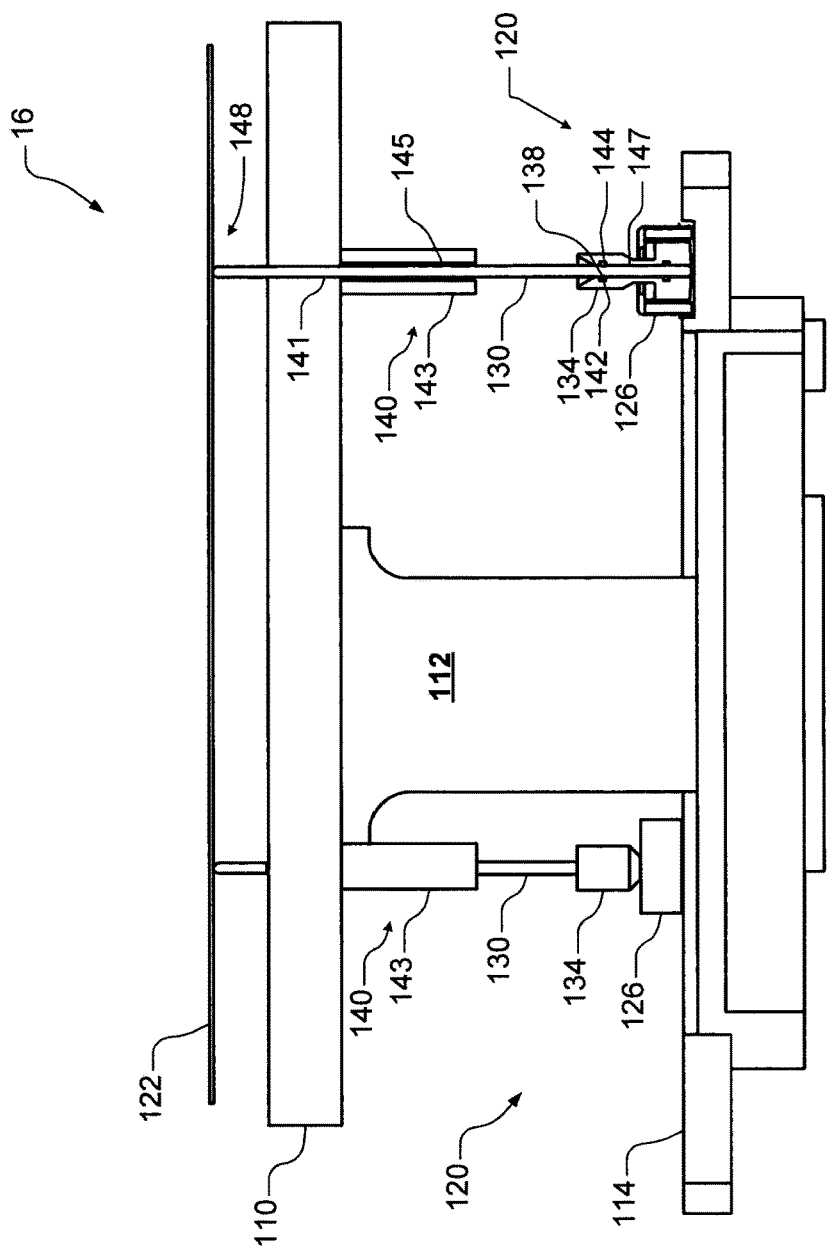
FIG. 2 is a side view and partial cross-sectional side view of an example of a substrate support and a lift pin holder assembly according to the present disclosure.

Referring now to FIG. 2, the substrate support assembly 16 is shown in further detail. The substrate support assembly 16 may be arranged in a processing chamber such as those shown in FIGS. 1A and 1B or any other substrate processing chamber. The substrate support assembly 16 includes a substrate supporting plate 110, a supporting column 112 and a base 114. In some examples, the supporting column 112 moves relative to the base 114.

Lift pin holder assemblies 120 are arranged below the substrate supporting plate 110 on the base 114. The lift pin holder assembly 120 includes a base portion 126, a lift pin 130, and a lift pin holder 134. In some examples, the lift pin 130 is generally cylindrically shaped and includes one or more grooves 138 arranged around a radially outer edge thereof. The lift pin holder 134 includes one or more grooves 144 arranged on a radially inner surface of a bore 147 that receives the lift pin 130.

One or more guiding elements 140 may be used to help guide the lift pin 130. In some examples, the guiding elements 140 include a cylindrical support 143 that is attached to a bottom surface of the substrate supporting plate 110. The cylindrical support 143 includes a bore 145 for receiving a middle portion the lift pin 130. Likewise, the substrate supporting plate 110 includes a bore 141 for receiving an upper portion of the lift pin 130.

During use, the supporting column 112 and/or the base 114 may be raised and lowered relative to the substrate supporting plate 110 to vary a height of the upper end of the lift pins 130 relative to an upper surface of the substrate supporting plate 110. As a result, the lift pins 130 lift the substrate 122 above the substrate supporting plate 110 or are positioned to receive the substrate to be loaded onto the substrate supporting plate 110. Clearance is provided between the substrate 122 and the upper surface of the substrate supporting plate 110 as shown at 148.

Referring now to FIGS. 3-4 various components of the lift pin holder assembly 120 are shown in further detail. The base portion 126 has a generally rectangular cross-section and defines an inner cavity 150 for receiving a lower portion 160 of the lift pin holder 134. In some examples, the lower portion 160 has a cylindrical outer cross-section, although other cross-sections may be used.

A middle portion 170 of the lift pin holder 134 extends from the lower portion 160. In some examples, the middle portion 170 of the lift pin holder 134 has a smaller outer diameter than the lower portion 160. In some examples, the middle portion 170 has cylindrical outer cross-section, although other cross-sections may be used.

An upper portion 180 of the lift pin holder 134 extends from the middle portion 170. In some examples, the upper portion 180 of the lift pin holder 134 includes a transitional portion 181 with an increasing diameter to transition from the middle portion 170 to the upper portion 180. In some examples, the transitional portion 181 has a cone-shaped outer cross-section, although other cross-sections can be used. In some examples, the upper portion 180 has a cylindrical outer cross-section, although other cross-sections may be used. The lower portion 160, the middle portion 170 and the upper portion 180 define the bore 147 for receiving the lift pin 130.

The upper portion 180 further includes an upper surface 186 defining an opening 187. In some examples, the opening 187 has having an inverted cone shape. The inverted cone shape can be used to direct the lift pin 130 into the lift pin holder 134. The bore 147 further includes the groove 144 for receiving the spring 142. Pin insertion and removal force can be adjusted by adjusting the number of springs, spring shape, lift pin groove profile, etc. One or more additional springs and grooves may be provided at a lower portion of the bore 147 as shown at 190.

Figure 5:
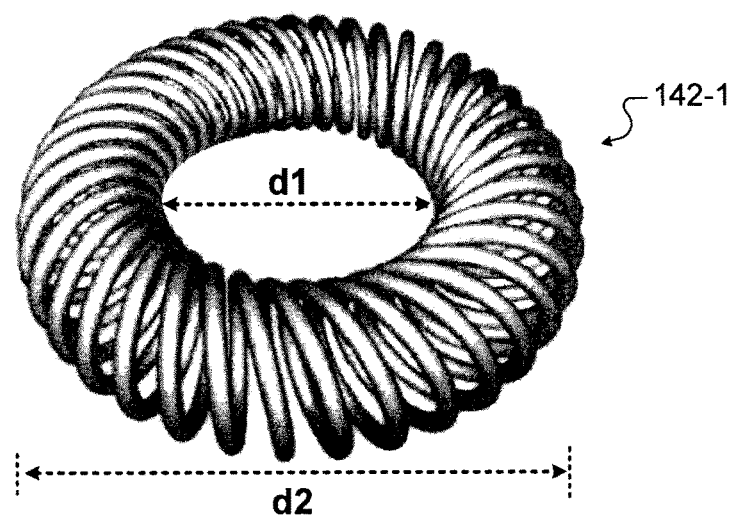
FIG. 5 is a perspective view of an example of a coil spring according to the present disclosure.

Referring now to FIG. 5, an example of the spring 142 of FIGS. 2-3 is shown. In some examples, the spring 142-1 includes a coil spring. In some examples, the coil spring is a canted coil spring. In some examples, the spring 142-1 is made of metal. In some examples, the spring 142-1 is made of nickel alloy, although other materials can be used.

Figure 6:
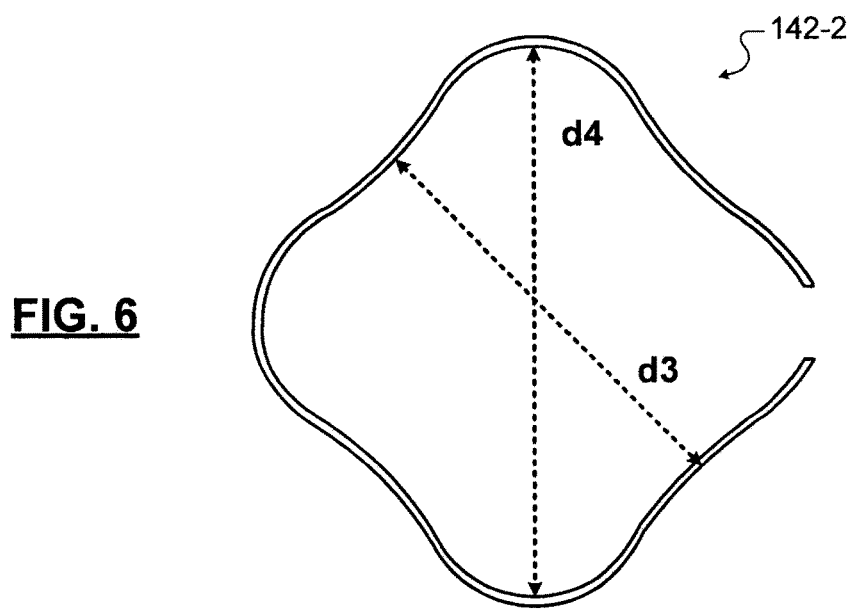
FIG. 6 is a plan view of an example of another spring according to the present disclosure.
Figure 7:
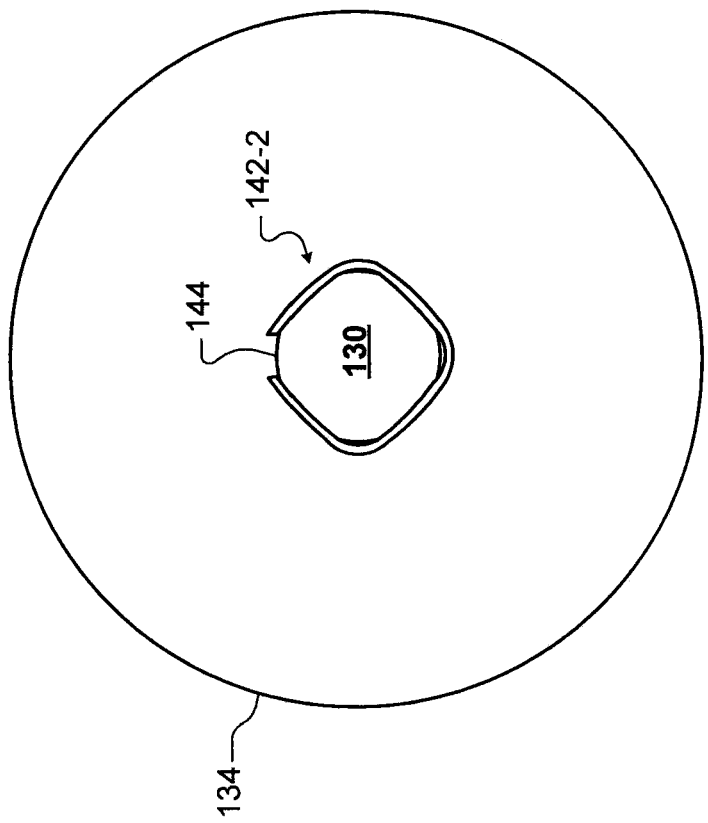
FIG. 7 is a plan view of the spring of FIG. 6 installed on a lift pin according to the present disclosure.

Referring now to FIG. 6-7, another example of the spring of FIGS. 2-3 is shown. In some examples, the spring 142-2 is generally square shaped with rounded corners and includes an opening 210. In some examples, mid-portions 220 of the spring 142-2 are separated by a distance d1 that is less than a diameter of lift pin 130 (to engage the groove 144). In some examples, corners 230 of the spring 142-2 are separated by a distance d2 that is greater than the diameter of the lift pin 130. In some examples, the spring 142-2 is made of metal. In some examples, the spring 142-1 is made of nickel alloy. In FIG. 6, the spring 142-2 of FIG. 5 is installed on the lift pin 130.

The lift pin holder assembly according to the present disclosure reduces metal mass and exposure in the processing chamber. Lift pin retention force is more repeatable and controllable. Lift pin retention force can be adjusted by adding multiple springs or changing the spring geometry.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer substrate support, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable end-point measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A lift pin holder assembly, comprising:
    a lift pin holder including a central bore extending in a first direction, wherein the central bore defines a first groove arranged transverse to the first direction on a radially inner surface of the central bore,
    wherein the lift pin holder is made of ceramic;
    a lift pin received in the central bore, extending in the first direction and including a second groove arranged transverse to the first direction on a radially outer surface thereof; and
    a spring at least partially arranged in the first groove of the lift pin holder and the second groove of the lift pin to retain the lift pin in the central bore of the lift pin holder.

2. The lift pin holder assembly of claim 1, wherein the spring comprises a metal.

3. The lift pin holder assembly of claim 1, wherein the spring comprises a metal including nickel alloy.

4. The lift pin holder assembly of claim 1, wherein the spring includes a coil spring.

5. The lift pin holder assembly of claim 1, wherein the spring includes a canted coil spring.

6. The lift pin holder assembly of claim 1, wherein the lift pin is made of a material including sapphire.

7. The lift pin holder assembly of claim 1, wherein the lift pin holder includes:
    a lower portion having a cylindrical outer cross-section;
    a middle portion having a cylindrical outer cross-section that has a smaller diameter than the cylindrical outer cross-section of the lower portion; and
    an upper portion having a cylindrical outer cross-section that has a smaller diameter than the cylindrical outer cross-section of the lower portion and a greater diameter than the cylindrical outer cross-section of the middle portion.

8. The lift pin holder assembly of claim 7, further comprising an inverted cone-shaped cavity located on a top surface of the upper portion.

9. A lift pin holder assembly, comprising:
    a lift pin holder including a central bore defining a first groove arranged on a radially inner surface of the central bore,
    wherein the lift pin holder is made of a non-metallic material;
    a lift pin including a second groove on a radially outer surface thereof; and
    a spring at least partially arranged in the first groove of the lift pin holder and the second groove of the lift pin to retain the lift pin in the central bore of the lift pin holder,
    wherein the spring has a rounded square shape with an opening located at one corner thereof, wherein opposite sides of the spring are separated by a distance that is less than an outer diameter of the lift pin and opposite corners that are separated by a distance that is greater than or equal to an outer diameter of the lift pin.

10. The lift pin holder assembly of claim 9, wherein the spring is made of nickel alloy.

11. A lift pin holder assembly, comprising:
    a lift pin holder including a central bore extending in a first direction, wherein the central bore defines a first groove arranged transverse to the first direction on a radially inner surface of the central bore,
    wherein the lift pin holder is made of ceramic;
    a lift pin received in the central bore, extending in the first direction and including a second groove arranged transverse to the first direction on a radially outer surface thereof; and a spring at least partially arranged in the first groove of the lift pin holder and the second groove of the lift pin to retain the lift pin in the lift pin holder, wherein the spring includes a coil spring that is made of metal.

12. The lift pin holder assembly of claim 11, wherein the metal includes nickel alloy.

13. The lift pin holder assembly of claim 11, wherein the coil spring includes a canted coil spring.

14. The lift pin holder assembly of claim 11, wherein the lift pin is made of a material including sapphire.

15. The lift pin holder assembly of claim 11, wherein the lift pin holder includes:
   a lower portion having a cylindrical outer cross-section;
   a middle portion having a cylindrical outer cross-section that has a smaller diameter than the cylindrical outer cross-section of the lower portion; and
   an upper portion having a cylindrical outer cross-section that has a smaller diameter than the cylindrical outer cross-section of the lower portion and a greater diameter than the cylindrical outer cross-section of the middle portion.

16. The lift pin holder assembly of claim 15, further comprising an inverted cone-shaped cavity located on a top surface of the upper portion.

17. A lift pin holder assembly, comprising:
   a lift pin holder including a central bore extending in a first direction, wherein the central bore defines a first groove arranged transverse to the first direction on a radially inner surface of the central bore, wherein the lift pin holder is made of ceramic and wherein the lift pin holder includes:
      a lower portion having a cylindrical outer cross-section;
      a middle portion having a cylindrical outer cross-section that has a smaller diameter than the cylindrical outer cross-section of the lower portion; and
      an upper portion having a cylindrical outer cross-section that has a smaller diameter than the cylindrical outer cross-section of the lower portion and a greater diameter than the cylindrical outer cross-section of the middle portion, wherein the upper portion includes an inverted cone-shaped cavity located on a top surface of the upper portion;
   a lift pin received in the central bore, extending in the first direction and including a second groove arranged transverse to the first direction on a radially outer surface thereof, wherein the lift pin is made of sapphire; and
   a spring that is made of metal and that is at least partially arranged in the first groove of the lift pin holder and the second groove of the lift pin to retain the lift pin in the lift pin holder.

18. The lift pin holder assembly of claim 17, wherein the spring includes a canted coil spring.

19. The lift pin holder assembly of claim 17, wherein the spring has a rounded square shape with an opening located at one corner thereof, wherein opposite sides of the spring are separated by a distance that is less than an outer diameter of the lift pin and opposite corners that are separated by a distance that is greater than or equal to an outer diameter of the lift pin.

* * * * *